United States Patent
Cheng et al.

(10) Patent No.: US 7,498,105 B2
(45) Date of Patent: Mar. 3, 2009

(54) METHOD FOR CHECKING PHASE SHIFT ANGLE OF PHASE SHIFT MASK, LITHOGRAPHY PROCESS AND PHASE SHIFT MASK

(75) Inventors: Yung-Feng Cheng, Kaohsiung (TW); Yueh-Lin Chou, Taichung (TW); Chin-Lung Lin, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 573 days.

(21) Appl. No.: 11/160,420

(22) Filed: Jun. 23, 2005

(65) Prior Publication Data

US 2006/0292455 A1    Dec. 28, 2006

(51) Int. Cl.
*G03F 9/00* (2006.01)

(52) U.S. Cl. .............................. 430/30; 430/5; 430/311; 382/144

(58) Field of Classification Search ..................... 430/5, 430/30, 311; 382/144
See application file for complete search history.

(56) References Cited

U.S. PATENT DOCUMENTS

| 5,439,767 A | 8/1995 | Yamashita et al. ............ 430/30 |
| 2004/0086788 A1 * | 5/2004 | Shiota et al. ................... 430/5 |

* cited by examiner

*Primary Examiner*—Christopher G Young
(74) *Attorney, Agent, or Firm*—Jianq Chyun IP Office

(57) ABSTRACT

A method for checking a phase shift angle of a PSM is described. A calibration curve of a characteristic value of lithography performance with respect to the phase shift angle of a type of PSM is acquired. The patterns of a PSM of the type to be checked are transferred to a photoresist layer to form photoresist patterns, and the characteristic value is measured. The real phase shift angle of the PSM is derived based on the characteristic value according to the calibration curve.

16 Claims, 5 Drawing Sheets

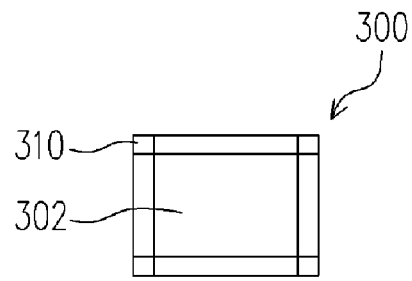
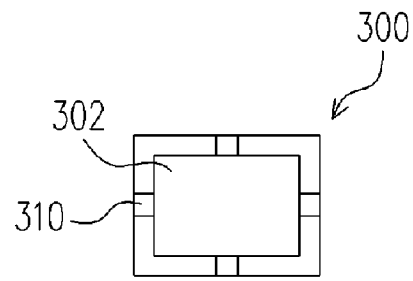
FIG. 3A  FIG. 3B
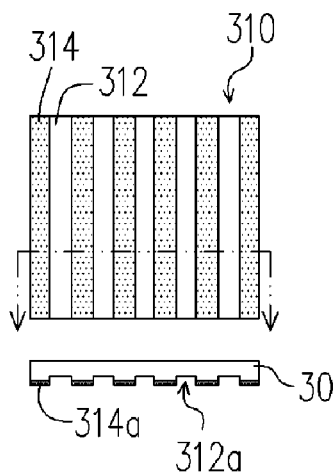
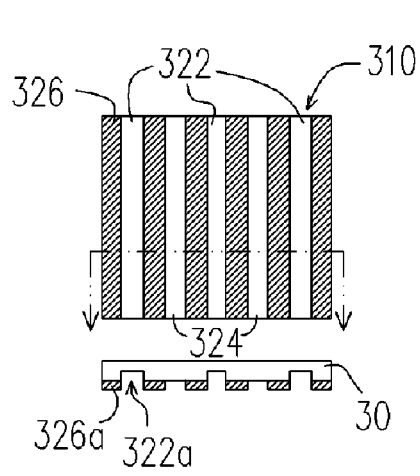
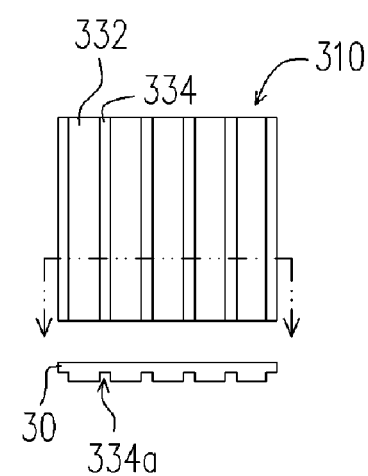
FIG. 4A  FIG. 4B  FIG. 4C
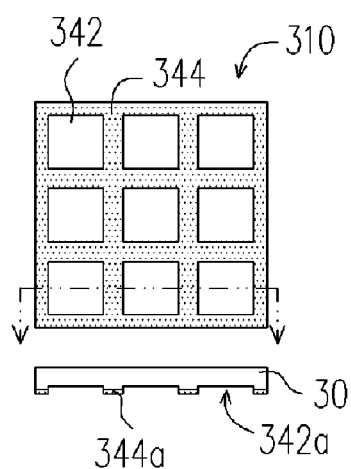
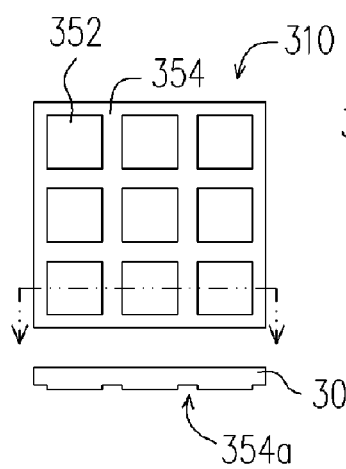
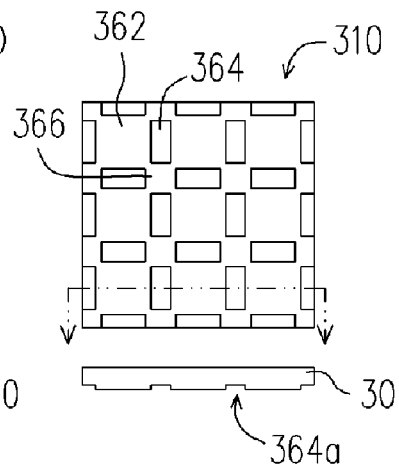
FIG. 5A  FIG. 5B  FIG. 5C

METHOD FOR CHECKING PHASE SHIFT ANGLE OF PHASE SHIFT MASK, LITHOGRAPHY PROCESS AND PHASE SHIFT MASK

BACKGROUND OF THE INVENTION

1. Field of the Invention

The present invention relates to the lithography technology. More particularly, the present invention relates to a method for checking a phase shift angle of a phase shift mask (PSM), to a lithography process utilizing the method for optimization, and to a phase shift mask of which the phase shift angle can be derived based on the method.

2. Description of the Related Art

In accompany with the requirement in increasing the integration degree of IC devices, the linewidths of advance semiconductor processes are mostly below the wavelength of the exposure light. When the linewidth is reduced to about a half of the wavelength or below, a phase shift mask is required to improve the resolution of the pattern transfer. Generally, a PSM utilizes a phase angle difference between adjacent light-transmittable regions to reduce the light amplitude at the portion of the photoresist layer requiring insufficient exposure to decrease the exposure dose thereat. Thus, the exposure contrast can be improved to enhance the resolution.

However, because the phase shift angle of a PSM is controlled usually by adjusting the substrate or film thickness in the transparent regions but the thickness is difficult to precisely control, the phase shift angle easily deviates from the required one. Consequently, the resolution is lowered and errors are caused in some characteristic values of the lithography performance including the pattern positions and/or the focus center as well as the depth of focus (DOF) and/or the critical dimension (CD) of the photoresist patterns. To solve the problem, a PSM has to be checked for its phase shift angle after being received from the vendor, wherein a proximity-type probed is usually used to measure the substrate or film thicknesses in the regions of different phase angles. If the phase shift angle is found to be erroneous, the exposure conditions can be adjusted accordingly to compensate the error in phase shift angle, or the PSM is returned to the manufacturer, who will calibrate the PSM and fabricate a new one accordingly.

Nevertheless, the above method of using a proximity-type probe to measure the thicknesses not only consumes much time, but also possibly damages the surface of the PSM to degrade the quality of pattern transfer.

SUMMARY OF THE INVENTION

In view of the foregoing, one object of this invention is to provide a method for checking a phase shift angle of a phase shift mask (PSM), which can save much time and doest not possibly damage the surface of the PSM.

Another object of this invention is to provide a lithography process that utilizes the above method of this invention for optimization.

Still another object of this invention is to provide a phase shift mask, of which the phase shift angle can be derived based on the above method of this invention.

The method for checking a phase shift angle of a PSM of this invention is described as follows. A calibration curve of a characteristic value of lithography performance with respect to the phase shift angle of a type of PSM is acquired. The patterns of a PSM of the type to be checked are transferred to a photoresist layer through exposure to form photoresist patterns, and the characteristic value is measured. The real phase shift angle of the PSM is derived based on the characteristic value according to the calibration curve.

In the above method, the characteristic value may be the depth of focus (DOF), the position of focus or the critical dimensions of the photoresist patterns, for example. The PSM of the type is possibly a half-tone (HT) PSM, an alternating PSM (Alt-PSM), a chromeless PSM or any other type of photomask with a phase-shift design. The photoresist patterns may include parallel line patterns or an array of opening patterns, while the exposure step for transferring the patterns of the PSM may be a dry exposure step or a wet exposure step.

In addition, when the photoresist patterns include parallel line patterns, the characteristic value used may be the position of focus or the DOF. When the PSM is a HT-PSM and the photoresist patterns include an array of opening patterns, the characteristic value used may be the position of focus or the DOF. When the PSM is a chromeless PSM and the photoresist patterns include an array of opening patterns, the characteristic value may also be the depth of focus (DOF) or the position of focus. Moreover, the calibration curve may be acquired with the following steps. A series of standard PSMs with known and different phase shift angles are used in lithography, and a series of the characteristic values corresponding to different standard PSMs are measured. Thereafter, the series of the characteristic values are plotted with respect to the phase shift angle.

The lithography process of this invention is described as follows. A calibration curve of a characteristic value of lithography performance with respect to the phase shift angle of a type of PSM is acquired. A PSM of the type is then used to conduct an exposure step, and the characteristic value is measured. The real phase shift angle of the PSM is derived based on the characteristic value according to the calibration curve. The exposure conditions are then adjusted according to the real phase shift angle to make the characteristic value achieve a predetermined value as required.

For the above lithography process of this invention, other features about the type of PSM, the type of the characteristic value, the type of the photoresist patterns to be formed and the method for acquiring the calibration curve may be the same as mentioned above.

The phase shift mask of this invention includes a transparent substrate, an IC pattern area on the transparent substrate, and at least one phase-shift-angle test pattern on the transparent substrate at the periphery of the IC pattern area. Each of the IC pattern area and the phase-shift-angle test pattern contains multiple first regions and second regions with a phase difference from the first regions, wherein the arrangement of the first and second regions in the IC pattern area is the same as that in the phase-shift-angle test pattern.

The transparent substrate usually has a rectangular shape, and there may be four phase-shift-angle test patterns disposed respectively at the four corners of the substrate. The number of phase-shift-angle test patterns is not restricted to four, while the phase-shift-angle test patterns may alternatively be disposed at the four edge portions of the transparent substrate.

Moreover, the above PSM may be a HT-PSM, an Alt-PSM, a chromeless PSM or any other type of photomask with a phase-shift design, and each of the IC pattern area and the phase-shift-angle test pattern contains patterns for forming parallel lines or an array of openings. When each of the IC pattern area and the phase-shift-angle test pattern contains patterns for forming an opening array or parallel lines, the PSM can be a HT-PSM or a chromeless PSM. In addition, the transparent substrate in the second regions may be recessed to cause a phase shift relative to the first regions.

Since the method of this invention derives the real phase shift angle of a PSM based on the measured characteristic value of lithography performance according to a calibration curve acquired previously, much time can be saved and the surface of the PSM will not be damaged. Meanwhile, since the characteristic value like DOF or position of focus can be measured after the exposure step to derive the real phase shift angle, in the lithography process of this invention, the exposure conditions can be adjusted quickly to compensate the error of the phase shift angle and make the characteristic value achieve a predetermined value as required.

Moreover, since at least one phase-shift-angle test pattern is disposed at the periphery of the IC pattern area on the PSM of this invention, the phase shift angle of the PSM can be checked simply with the phase-shift-angle test pattern. Therefore, the phase shift angle can be checked easily, and the transfer of the IC patterns will not be affected.

It is to be understood that both the foregoing general description and the following detailed description are exemplary, and are intended to provide further explanation of the invention as claimed.

BRIEF DESCRIPTION OF THE DRAWINGS

FIGS. 3A and 3B illustrate two examples of the PSM of this invention, wherein the positions of the phase-shift-angle test patterns are different in the two examples.

FIGS. 4A-4C each illustrates a top view and a cross-sectional view of a local structure of an exemplary phase-shift-angle test pattern on a different type of PSM for forming parallel line patterns.

FIG. 5A illustrates a top view and a cross-sectional view of a local structure of an exemplary phase-shift-angle test pattern on a half-tone PSM for forming an array of opening patterns, while FIGS. 5B and 5C each illustrates a top view and a cross-sectional view of a local structure of an exemplary phase-shift-angle test pattern on a chromeless PSM for forming an array of opening patterns.

DESCRIPTION OF THE PREFERRED EMBODIMENTS

Figure 1:
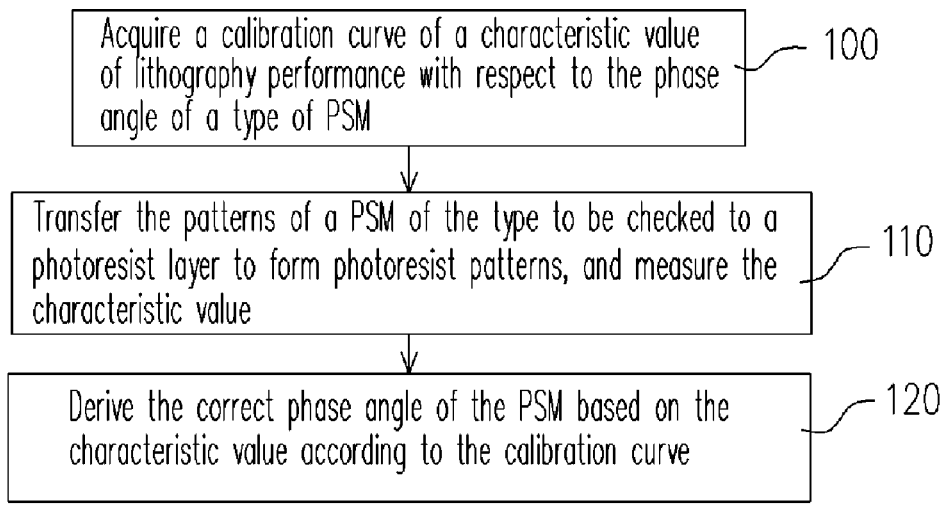
FIG. 1 shows a process flow of a method for checking the phase shift angle of a PSM according to this invention.

FIG. 1 shows a process flow of a method for checking the phase shift angle of a PSM according to this invention. Referring to FIG. 1, a calibration curve of a characteristic value of lithography performance with respect to the phase shift angle of a type of PSM is acquired in step 100. The characteristic value is preferably the depth of focus (DOF), the position of focus or the critical dimension (CD) of the photoresist patterns, while the type of PSM is, for example, half-tone type, alternating type, chromeless type or any other type with a phase-shift design. In addition, the calibration curve may be acquired by the following steps. A series of standard PSMs with known and different phase shift angles are used in lithography, and a series of the characteristic values corresponding to different standard PSMs are measured. Then, the series of the characteristic values are plotted with respect to the phase shift angle. In this method, the phase shift angles of the standard PSMs can be precisely determined with the above-mentioned proximity-type probe.

In next step 110, the patterns of a PSM of the type to be checked are transferred to a photoresist layer through exposure to form photoresist patterns, and the characteristic value is measured. When the characteristic value to be measured is the position or depth of focus, the measurement can be done after the exposure step for transferring the patterns. When the characteristic value to be measured is the CD of the photoresist patterns, the measurement must be done after the development step. The exposure step can be a dry exposure step or a wet exposure step, in which a liquid medium is filled between the object lens of the exposure optical system and the photoresist layer to reduce the refraction of the light incident into the photoresist layer and thereby improve the resolution. In addition, the patterns transferred onto the photoresist layer may be parallel line patterns or an array of opening patterns.

Thereafter, in step 120, a real phase shift angle of the PSM is derived based on the characteristic value according to the calibration curve.

Figure 2:
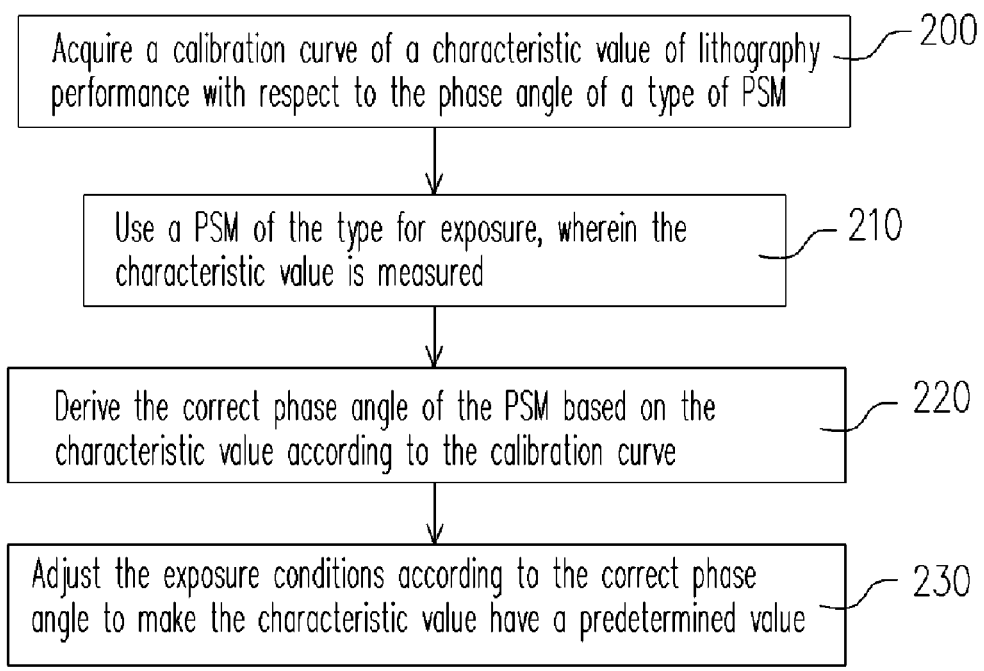
FIG. 2 shows a flow chart of a lithography process of this invention.

FIG. 2 shows a flow chart of a lithography process of this invention. In step 200, a calibration curve of a characteristic value of lithography performance with respect to the phase shift angle of a type of PSM is acquired, wherein the type of PSM, the type of the characteristic value, the type of the photoresist patterns to be formed and the method for acquiring the calibration curve may be the same as above. In next step 210, a PSM of the type is used to conduct an exposure step, wherein the characteristic value is measured.

Thereafter, in step 220, the real phase shift angle of the PSM is derived based on the characteristic value according to the calibration curve, and the exposure conditions are adjusted according to the real phase shift angle to make the characteristic value achieve a predetermined value as required in step 230.

On the other hand, FIGS. 3A and 3B illustrate two examples of the PSM according to this invention. The PSM 300 includes an integrated circuit (IC) pattern area 302 and at least one phase-shift-angle test pattern 310 at the periphery of the IC pattern area 302, wherein the phase-shift-angle test pattern 310 contains the same phase shift patterns in the IC pattern area 302 and is formed simultaneously with the IC pattern area 302 to have the same phase shift angle. Since the phase-shift-angle test pattern 310 is disposed at the periphery of the IC pattern area 302, the photoresist pattern corresponding to the phase-shift-angle test pattern 310 is located in the scribe line region of the wafer (not shown).

In the case of FIG. 3A, four phase-shift-angle test patterns 310 are disposed respectively at the four corners of the rectangular PSM 300. In the case of FIG. 3B, multiple phase-shift-angle test patterns 310 are disposed at the four edge portions of the rectangular PSM 300. The number of the phase-shift-angle test patterns 310 disposed is not restricted to 4, and the phase-shift-angle test patterns 310 can alternatively be disposed at any other positions at the periphery of the integrated circuit pattern area 302 if not conflicting with the alignment marks and other types of test patterns that are usually disposed in the prior art.

FIGS. 4A-4C each illustrates a top view and a cross-sectional view of a local structure of an exemplary phase-shift-angle test pattern on a different type of PSM for forming parallel line patterns.

FIG. 4A illustrates a top view and a cross-sectional view of a local structure of an exemplary phase-shift-angle test pattern on a HT-PSM for forming parallel line patterns. The phase-shift-angle test pattern 310 includes linear transparent regions 312 and linear semi-transparent regions 314 with a phase shift of 180 degrees, wherein the transparent regions 312 and the semi-transparent regions 314 are arranged alternately and the transparency of the semi-transparent regions 314 is usually 6%. The low transparency of the semi-transparent regions 314 may be caused by a semi-transparent ultra-thin Cr or molybdenum silicide (MoSi) film 314a formed on the transparent substrate 30. In general, the semi-transparent regions 314 utilize the thickness of the metal film 314a to produce a phase shift approaching 180 degrees, and the substrate 30 in the transparent regions 312 is shallowly etched to form trenches 312a in the etching step for patterning the metal film 314a. By controlling the depth of the trenches 312a in combination with the thickness of the metal films 314a to produce an optimal phase shift angle, the exposure contrast can be increased to improve the resolution.

FIG. 4B illustrates a top view and a cross-sectional view of a local structure of an exemplary phase-shift-angle test pattern on an Alt-PSM for forming parallel lines. The phase-shift-angle test pattern 310 may include linear transparent regions 322, linear transparent regions 324 with a phase shift of 180 degrees and linear opaque regions 326, wherein the transparent regions 322 and 324 are arranged alternately and any two adjacent transparent regions 322 and 324 are separated by an opaque region 326. The opaque regions 326 may include a sufficiently thick Cr film 326a to block the exposure light. The phase shift angle may be caused by etching the substrate 30 in the transparent regions 322 to form trenches 322a and produce a substrate thickness difference between the transparent regions 322 and 324.

FIG. 4C illustrates a top view and a cross-sectional view of a local structure of an exemplary phase-shift-angle test pattern on an chromeless PSM for forming parallel line patterns. The phase-shift-angle test pattern 310 includes linear transparent regions 332 and narrower linear transparent regions 334 with a phase shift of 180 degrees, wherein the transparent regions 332 and 334 are arranged alternately. Since the transparent regions 334 are narrower and have a phase shift of 180 degrees from the transparent regions 332, the portions of the photoresist layer corresponding to the transparent regions 334 and the two portions of each transparent regions 332 near the two adjacent transparent regions 334 are insufficiently exposed to form patterns (when positive photoresist is used) or to be removable (when negative photoresist is used). The phase shift angle may be caused by etching the substrate 30 in the transparent regions 334 to form trenches 334a, or by etching the substrate 30 in the transparent regions 332 to form corresponding trenches (not shown), to produce a substrate thickness difference between the transparent regions 332 and 334.

FIG. 5A illustrates a top view and a cross-sectional view of a local structure of an exemplary phase-shift-angle test pattern on a half-tone PSM for forming an array of opening patterns. The phase-shift-angle test pattern 310 includes transparent regions 342 corresponding to the opening patterns and a grid-like semi-transparent region 344 with a phase shift of 180 degrees, wherein the transparency of the semi-transparent region 344 is usually 6%. The low transparency of the semi-transparent region 344 may be caused by a semi-transparent ultra-thin Cr or MoSi film 344a formed on the substrate 30. As in the case of FIG. 4A, the semi-transparent region 344 utilize the thickness of the metal film 344a to produce a phase shift approaching 180 degrees, and the substrate 30 in the transparent regions 342 is shallowly etched to form recesses 342a. By controlling the depth of the recesses 342a in combination with the thickness of the metal films 344a to produce an optimal phase shift angle, the exposure contrast can be increased to improve the resolution.

FIGS. 5B and 5C each illustrates a top view and a cross-sectional view of a local structure of an exemplary phase-shift-angle test pattern on a chromeless PSM for forming an array of opening patterns. The phase-shift-angle test patter 310 of FIG. 5B contains a conventional pattern design on a chromeless PSM for forming an opening array, including transparent regions 352 corresponding to the opening and a grid-like transparent region 354 with a phase shift of 180 degrees. The phase shift angle may be caused by etching the substrate 30 in the grid-like transparent region 354 to form a grid-like trench 354a, or by etching the substrate 30 in the transparent regions 352 to form corresponding recesses (not shown), to produce a substrate thickness difference between the transparent regions 352 and 354.

However, when the conventional pattern design of FIG. 5B is used, the amplitude of the light through a portion of the transparent region 354 between four adjacent transparent regions 352 often cannot be negated effectively, so that a small hole is easily formed between four adjacent openings in the photoresist layer. Therefore, in the special pattern design of FIG. 5C, the region between four adjacent transparent regions 362 corresponding to four openings is changed to a transparent region 366 having the same phase of the transparent regions 362. The phase of the transparent region 366 is different, by 180 degrees, from that of the transparent regions 364 each between two adjacent transparent regions 362, so that the amplitude of the light through the transparent region 366 can be effectively negated by the four transparent regions 364 around the transparent region 366 to prevent formation of extra small holes in the photoresist layer. Similarly, the phase shift angle may be caused by etching the substrate 30 in the transparent regions 364 to form short trenches 364a, or by etching the substrate 30 in the transparent regions 362 and 366 to form corresponding large and small recesses that are connected at their corners, to produce a substrate thickness difference between the transparent regions 362/366 and 364.

Figure 6:
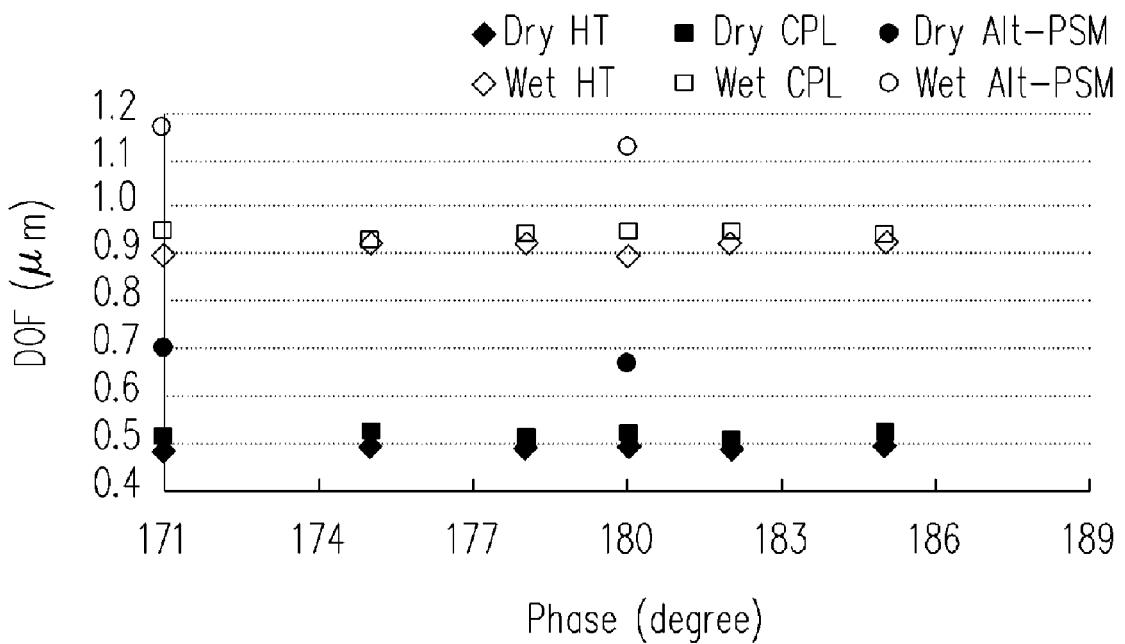
FIGS. 6/7/8 shows the computer simulation results of the variations of DOF/CD/"position of focus" with the phase shift angle for three types of PSM for forming parallel line patterns as well as for two types (dry and wet) of exposure methods.

FIGS. 6/7/8 shows the computer simulation results of the variations of DOF/CD/"position of focus" with phase shift angle for three types of PSM for forming parallel line patterns as well as for two types (dry and wet) of exposure methods.

Referring to FIG. 6, in this case, no matter the PSM is a half-tone, alternating or chromeless PSM or the exposure method is of dry or wet type, the depth of focus is insensitive to the change of the phase shift angle. Therefore, in the cases wherein parallel line patterns are to be formed, the depth of focus is not a suitable parameter for deriving the phase shift angle.

Figure 7:
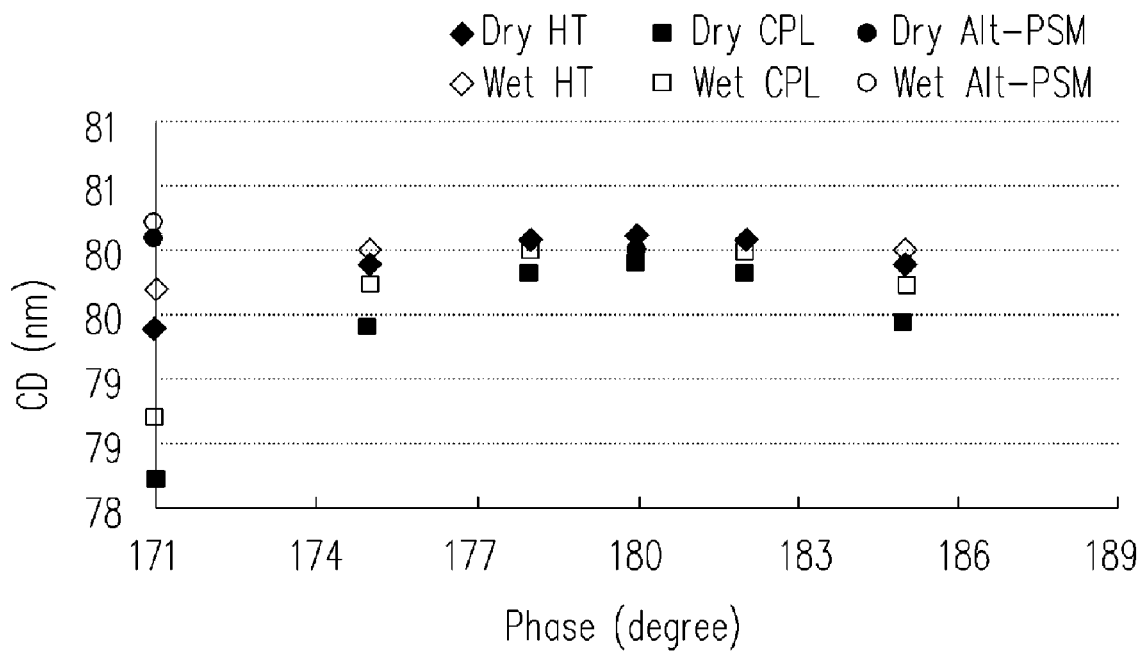
Figure 8:
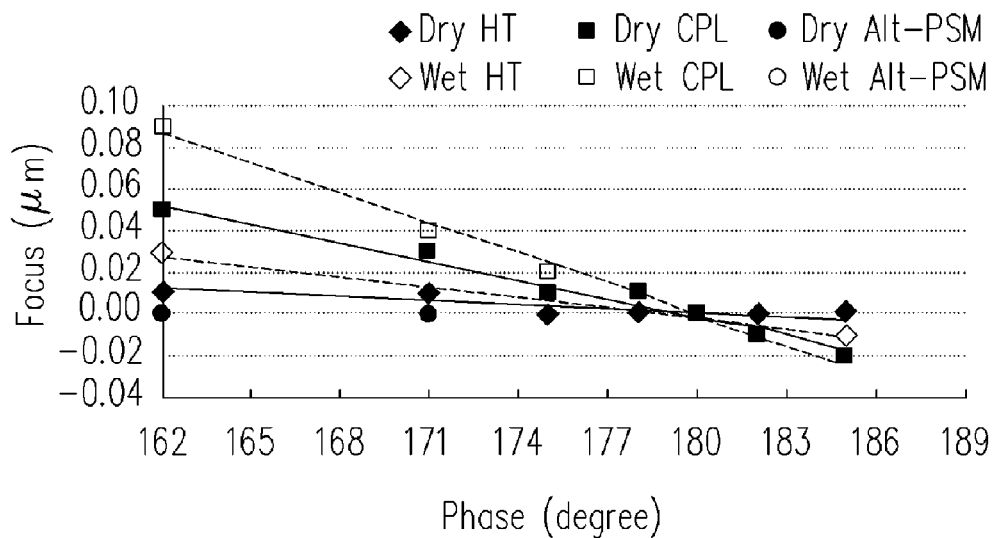

Referring to FIG. 7, in this case, the critical dimension is slightly more sensitive to the change of phase shift angle than the depth of focus is, and can barely be used to derive the phase shift angle. However, as shown in FIG. 8, the position of focus is linearly dependent on the phase shift angle, and the sensitivity of the position of focus to the phase shift angle is mostly above 5 nm/degree. Therefore, in the cases wherein parallel line patterns are to be formed, the position of focus is a preferred parameter for deriving the phase shift angle.

Figure 9:
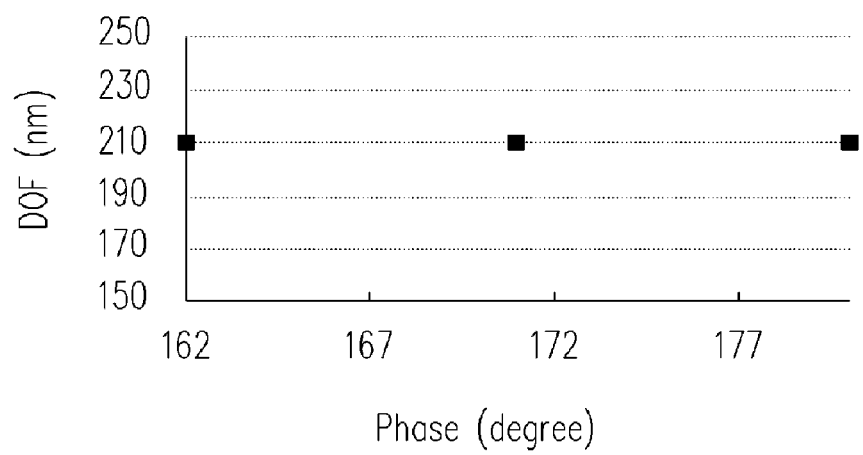
FIGS. 9/10 shows the computer simulation result of the variation of DOF/"position of focus" with the phase shift angle for a half-tone PSM for forming an array of opening patterns.

FIGS. 9/10 shows the computer simulation result of the variation of DOF/"position of focus" with the phase shift angle for a half-tone PSM for forming an array of opening patterns.

Figure 10:
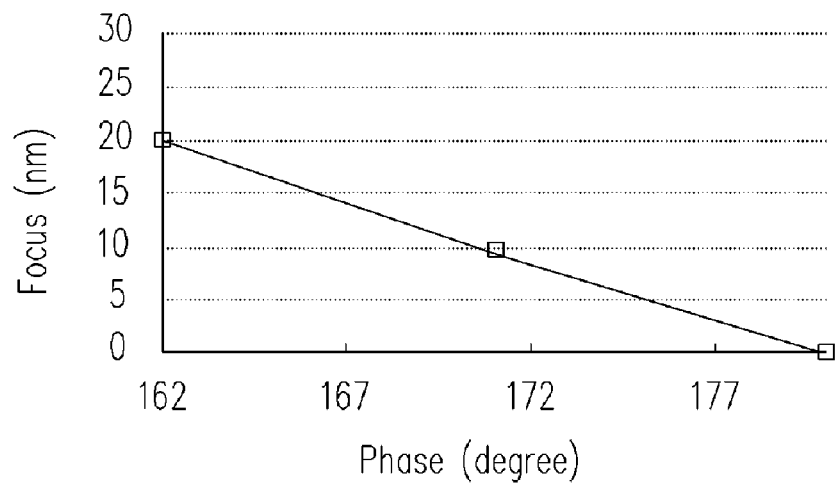

Referring to FIG. 9, in this case, the DOF is insensitive to the change of phase shift angle, and is therefore not a suitable parameter for deriving the phase shift angle. On the contrary, as shown in FIG. 10, the position of focus is quite sensitive to the phase shift angle, and is therefore a preferred parameter for deriving the phase shift angle.

Figure 11:
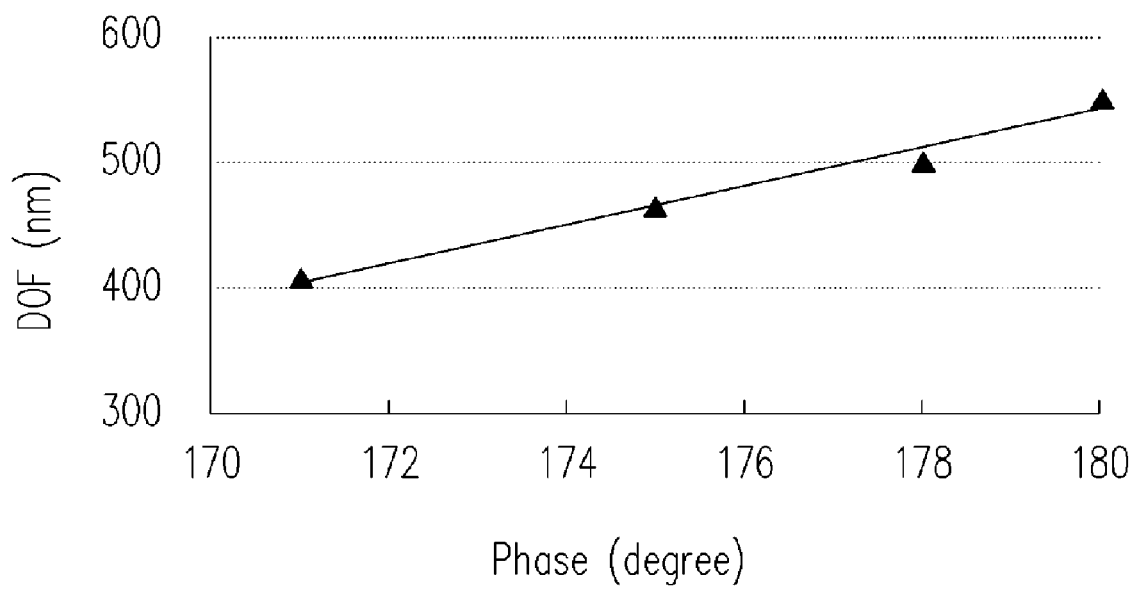
FIGS. 11/12 shows the computer simulation result of the variation of DOF/"position of focus" with phase shift angle for a chromeless PSM for forming an array of opening patterns, wherein a local structure of the PSM is shown in FIG. 5C.

FIGS. 11/12 shows the computer simulation result of the variation of DOF/"position of focus" with phase shift angle for a chromeless PSM for forming an array of opening patterns, wherein a local structure of the PSM is shown in FIG. 5C.

Figure 12:
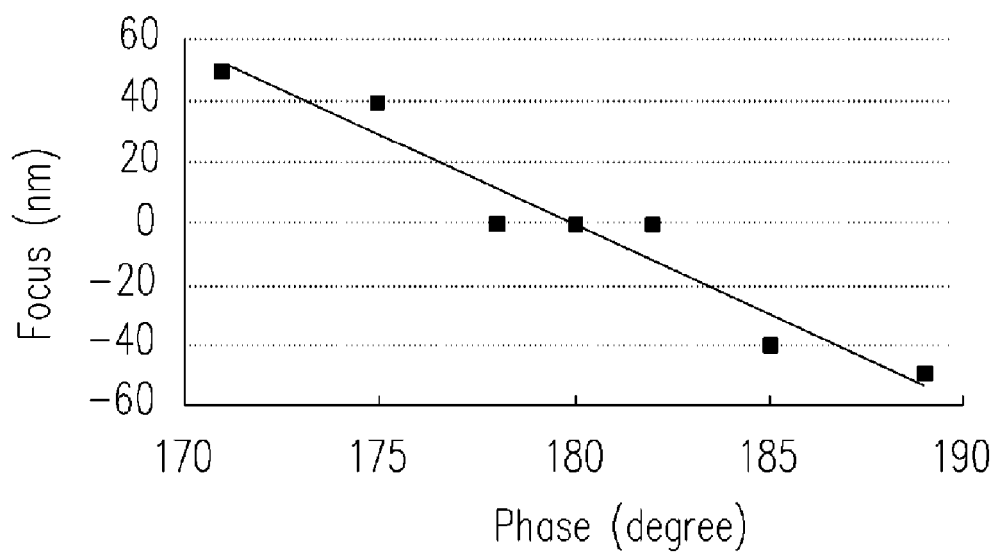

Referring to FIGS. 11 and 12, in this case, the DOF and the position of focus both are quite sensitive to the phase shift angle. Therefore, both of them are preferred parameters for deriving the phase shift angle when a chromeless PSM for forming an array of opening patterns is used.

As mentioned above, the method of this invention derives the real phase shift angle of a PSM based on a measured characteristic value of lithography performance according to a calibration curve acquired previously, so that much time can be saved and the surface of the PSM will not be damaged.

Moreover, since the characteristic value like DOF or position of focus can be measured after the exposure step to derive the real phase shift angle, in the lithography process of this invention, the exposure conditions can be adjusted quickly to compensate the error of the phase shift angle and make the characteristic value achieve a predetermined value as required. In addition, since at least one phase-shift-angle test pattern is disposed at the periphery of the IC pattern area on the PSM of this invention, the phase shift angle of the PSM can be checked simply with the phase-shift-angle test pattern. Therefore, the phase shift angle can be checked easily, and the transfer of the IC patterns will not be affected.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for checking a phase shift angle of a phase shift mask (PSM), comprising:
    acquiring a calibration curve of a characteristic value of lithography performance with respect to a phase shift angle of a type of PSM;
    transferring patterns of a PSM of the type to be checked to a photoresist layer to form photoresist patterns, and measuring the characteristic value; and
    deriving a real phase shift angle of the PSM based on the characteristic value according to the calibration curve, wherein the characteristic value comprises a position of focus, a depth of focus (DOF) or a critical dimension (CD) of the photoresist patterns.

2. The method of claim 1, wherein the PSM of the type is a half-tone (HT) PSM, an alternating PSM (Alt-PSM), a chromeless PSM or any other type of photomask with a phase-shift design.

3. The method of claim 1, wherein the photoresist patterns comprise parallel line patterns or an array of opening patterns.

4. The method of claim 1, wherein an exposure step for transferring the patterns of the PSM comprises a dry exposure step or a wet exposure step.

5. The method of claim 1, wherein the photoresist patterns comprise parallel line patterns and the characteristic value is a position of focus or a depth of focus (DOF).

6. The method of claim 1, wherein the PSM is a half-tone PSM, the photoresist patterns comprise an array of opening patterns, and the characteristic value is a position of focus or a depth of focus (DOF).

7. The method of claim 1, wherein the PSM is a chromeless PSM, the photoresist patterns comprise an array of opening patterns, and the characteristic value is a depth of focus (DOF) or a position of focus.

8. The method of claim 1, wherein the calibration curve is acquired with steps comprising:
    using a series of standard PSMs with known and different phase shift angles in lithography;
    measuring a series of the characteristic values corresponding to different standard PSMs; and
    plotting the series of the characteristic values with respect to the phase shift angle.

9. A lithography process, comprising:
    acquiring a calibration curve of a characteristic value with respect to a phase shift angle of a type of phase shift mask (PSM);
    using a PSM of the type for exposure, and measuring the characteristic value;
    deriving a real phase shift angle of the PSM based on the characteristic value according to the calibration curve, wherein the characteristic value comprises a position of focus, a depth of focus (DOF) or a critical dimension (CD) of the photoresist patterns; and
    adjusting exposure conditions according to the real phase shift angle to make the characteristic value achieve a predetermined value.

10. The lithography process of claim 9, wherein the PSM of the type is a half-tone (HT) PSM, an alternating PSM (Alt-PSM), a chromeless PSM or any other type of photomask with a phase-shift design.

11. The lithography process of claim 9, wherein the PSM is for forming parallel line patterns or an array of opening patterns.

12. The lithography process of claim 9, wherein the exposure comprises dry or wet exposure.

13. The lithography process of claim 9, wherein the PSM is for forming parallel line patterns and the characteristic value is a position of focus or a depth of focus (DOF).

14. The lithography process of claim 9, wherein the PSM is a half-tone PSM and is for forming an array of opening patterns, and the characteristic value is a position of focus or a depth of focus (DOF).

15. The lithography process of claim 9, wherein the PSM is a chromeless PSM and is for forming an array of opening patterns, and the characteristic value is a depth of focus (DOF) or a position of focus.

16. The lithography process of claim 9, wherein the calibration curve is acquired with steps comprising:
    using a series of standard PSMs with known and different phase shift angles in lithography;
    measuring a series of the characteristic values corresponding to different standard PSMs; and
    plotting the series of the characteristic values with respect to the phase shift angle.

* * * * *